United States Patent
Aoyagi et al.

(10) Patent No.: US 8,181,527 B2
(45) Date of Patent: May 22, 2012

(54) METHOD AND APPARATUS FOR PASS/FAIL DETERMINATION OF BONDING AND BONDING APPARATUS

(75) Inventors: Nobuyuki Aoyagi, Tokyo (JP); Kohei Seyama, Tokyo (JP)

(73) Assignee: Shinkawa Ltd., Tokyo (JP)

( * ) Notice: Subject to any disclaimer, the term of this patent is extended or adjusted under 35 U.S.C. 154(b) by 0 days.

(21) Appl. No.: 13/005,746

(22) Filed: Jan. 13, 2011

(65) Prior Publication Data

US 2011/0146408 A1 Jun. 23, 2011

Related U.S. Application Data

(63) Continuation of application No. PCT/JP2008/072814, filed on Dec. 16, 2008.

(30) Foreign Application Priority Data

Jul. 16, 2008 (JP) .................................. 2008-184386

(51) Int. Cl.
   *G01N 29/04* (2006.01)
(52) U.S. Cl. .......................................... 73/588; 73/582
(58) Field of Classification Search ............ 73/588
   See application file for complete search history.

(56) References Cited

U.S. PATENT DOCUMENTS 7,735,707 B2 6/2010 Seyama

FOREIGN PATENT DOCUMENTS

| JP | 7-74215 | 3/1995 |
|---|---|---|
| JP | 2002-118136 | 4/2002 |
| JP | 2003-258021 | 9/2003 |
| JP | 2008-21839 | 1/2008 |

OTHER PUBLICATIONS

International Search Report dated Feb. 10, 2009, from the corresponding International Application.

*Primary Examiner* — Hezron E Williams
*Assistant Examiner* — Gregory J Redmann
(74) *Attorney, Agent, or Firm* — Katten Muchin Rosenman LLP

(57) ABSTRACT

An apparatus for pass/fail determination of bonding used in a bonding apparatus, includes: an ultrasonic horn configured to vibrate longitudinally in resonance with the vibration of an ultrasonic vibrator; a capillary attached at an anti-node of the vibration of the ultrasonic horn; a flange provided at a node of the vibration of the ultrasonic horn; a bonding arm; and a load sensor attached between the center of rotation of the bonding arm and a flange mounting surface in an offset manner from a longitudinal central axis of the ultrasonic horn, in which a load on the capillary in the direction toward and away from the bonding target is continuously detected by using the load sensor during bonding operation and the maximum value of the detected load is defined as an impact load to determine pass/fail of the bonding based on the impact load, thereby allowing a mid-bonding pass/fail determination.

6 Claims, 8 Drawing Sheets

METHOD AND APPARATUS FOR PASS/FAIL DETERMINATION OF BONDING AND BONDING APPARATUS

BACKGROUND OF THE INVENTION

1. Field of the Invention

The present invention relates to a method and apparatus for pass/fail determination of bonding for use in bonding apparatuses and to a structure of a bonding apparatus for pass/fail determination of bonding.

2. Description of the Related Art

In semiconductor manufacturing processes, wire-bonding apparatuses are often used for bonding of thin metallic wires to electrode pads on a semiconductor chip and electrode leads on a lead frame for connection therebetween. Many wire-bonding apparatuses include a bonding arm configured to be rotated with a drive motor, an ultrasonic horn attached to the bonding arm, a capillary attached at one end of the ultrasonic horn, and an ultrasonic vibrator attached to the ultrasonic horn. In such wire-bonding apparatuses, the bonding arm is driven and rotated to move the capillary in a direction toward and away from a pad or lead and to press and bond an initial ball formed at a tip end of the capillary or a wire to the pad or lead, and then the ultrasonic horn is resonated by the ultrasonic vibrator to provide ultrasonic vibration at the tip end of the capillary for bonding operation.

In the case of bonding using such a wire-bonding apparatus, an initial ball formed at a tip end of a wire that is inserted through the capillary collides with a pad at a certain speed and then is pressed and bonded at a constant load to the pad to be a bonded ball. The collision causes the wire and capillary to vibrate in the pressing direction also during the subsequent period of pressing at the constant load, and thereby the pressing load to fluctuate and the shape and diameter of the bonded ball to vary, which can result in defective bonding. Also in the case of an initial ball formed defectively smaller than a predetermined size, the pressing load can fluctuate to result in defective bonding.

To address the problem, wire-bonding apparatuses generally include an encoder provided in a bonding head to detect the change in the height position of the capillary, in which a detection output of the encoder is fed back to a controller to control the output of the drive motor and thereby to prevent the pressing load from fluctuating. However, since the encoder cannot detect the pressing load on the wire directly, the fluctuation of the pressing load cannot be suppressed sufficiently only by feed-backing the output of the encoder.

Hence, there has been proposed a method in which a pressure sensor is provided between an ultrasonic horn and a bonding arm to detect pressing load, and the drive motor is controlled by the pressing load to suppress the vibration of the capillary and thereby to make the pressing load constant (see Japanese Unexamined Patent Application Publication No. 2003-258021, for example).

In addition, if there is mechanical loosening or wear on the bonding arm and/or capillary, a force of impact when a wire on the capillary collides with a pad on a semiconductor chip during wire-bonding operation can cause chip damage in which such as the semiconductor chip has cracks thereon. To address this problem, there has been proposed a method in which an impact sensor for measuring a force of impact is attached to the bonding stage and, based on the difference between a detected waveform and a reference waveform, an alarm is generated to notify of the existence of mechanical loosening or wear on the bonding arm and/or capillary (see Japanese Unexamined Patent Application Publication No. 7-74215, for example).

In contrast, in the case of bonding between a semiconductor chip and a substrate, multiple pads on the semiconductor chip are connected sequentially to multiple leads on the substrate. During such bonding operation, even if there can be no loosening or wear on the bonding arm and/or capillary and the pressing load from the capillary onto the pads can be controlled at a predetermined value, there may occur defective bonding such as abnormal ball deformation and/or chip damage. However, the related arts described in Japanese Unexamined Patent Application Publication Nos. 2003-258021 and 7-74215 cannot detect defective bonding, if any, during the bonding operation before a visual inspection step for bonded portions to be performed after the bonding between multiple pads on the semiconductor chip and multiple leads on the substrate has been completed. This suffers from a problem of taking a long time for product revision. Further, if the manufacturing process includes no visual inspection step for bonded portions, defective products, if any, cannot be found before the final inspection step, suffering from a problem of reduction in production yield.

BRIEF SUMMARY OF THE INVENTION

It is hence an object of the present invention to make a mid-bonding pass/fail determination.

The present invention is directed to a method of pass/fail determination of bonding, including: preparing a bonding apparatus including: a base unit; an ultrasonic horn configured to vibrate longitudinally in resonance with the vibration of an ultrasonic vibrator; a bonding tool attached at an antinode of the vibration of the ultrasonic horn; a flange provided at a node of the vibration of the ultrasonic horn; a bonding arm including a flange mounting surface, the flange being fixed to the ultrasonic horn, and attached rotatably to the base unit in such a manner as to move a tip end of the bonding tool in a direction toward and away from a bonding target; and a load sensor attached between the center of rotation of the bonding arm and the flange mounting surface in an offset manner in the direction toward and away from the bonding target from a longitudinal central axis of the ultrasonic horn; continuously detecting a load on the bonding tool in the direction toward and away from the bonding target using the load sensor during bonding operation; defining the maximum value of the detected load as an impact load; and determining pass/fail of the bonding based on the impact load.

The method of pass/fail determination of bonding according to the present invention can preferably be arranged such that if the impact load is larger than a predetermined threshold value, the bonding is determined to be defective. Alternatively, the method can preferably be arranged to include: extracting a signal within a frequency range lower than the resonant frequency of the ultrasonic vibrator, except for a signal within a frequency range of the natural resonance frequency to the ultrasonic horn, from a load signal detected with the load sensor through a filter that a signal within the frequency range of the natural resonance frequency to the ultrasonic horn is cut off and that is able to pass the signal within the frequency range lower than the resonant frequency of the ultrasonic vibrator; and determining pass/fail of the bonding based on the extracted signal. The method can preferably be further arranged such that after the grounding of the bonding tool, if the rate of increase in the load signal detected with the load sensor to time is greater than a threshold value, it is determined that there is abnormal ball deformation.

The present invention is also directed to an apparatus for pass/fail determination of bonding used in a bonding apparatus, the apparatus including: a base unit; an ultrasonic horn configured to vibrate longitudinally in resonance with the vibration of an ultrasonic vibrator; a bonding tool attached at an anti-node of the vibration of the ultrasonic horn; a flange provided at a node of the vibration of the ultrasonic horn; a bonding arm including a flange mounting surface, the flange being fixed to the ultrasonic horn and attached rotatably to the base unit in such a manner as to move a tip end of the bonding tool in a direction toward and away from a bonding target; and a load sensor attached between the center of rotation of the bonding arm and the flange mounting surface in an offset manner in the direction toward and away from the bonding target from a longitudinal central axis of the ultrasonic horn, in which the apparatus is extracting a signal within a frequency range lower than the resonant frequency of the ultrasonic vibrator, except for a signal within a frequency range of the natural resonance frequency to the ultrasonic horn, from a load signal detected with the load sensor through a filter that a signal within the frequency range of the natural resonance frequency to the ultrasonic horn is cut off and that is able to pass the signal within the frequency range lower than the resonant frequency of the ultrasonic vibrator, defining the maximum value of the extracted signal as an impact load, and determining pass/fail of the bonding based on the impact load.

The present invention is further directed to a bonding apparatus including: a base unit; a base unit; an ultrasonic horn configured to vibrate longitudinally in resonance with the vibration of an ultrasonic vibrator; a bonding tool attached at an anti-node of the vibration of the ultrasonic horn; a flange provided at a node of the vibration of the ultrasonic horn; a bonding arm including a flange mounting surface, the flange being fixed to the ultrasonic horn and attached rotatably to the base unit in such a manner as to move a tip end of the bonding tool in a direction toward and away from a bonding target; a load sensor attached between the center of rotation of the bonding arm and the flange mounting surface in an offset manner in the direction toward and away from the bonding target from a longitudinal central axis of the ultrasonic horn; a control unit for pass/fail determination of bonding; the control unit including: filter means for cutting off a signal within the frequency range of the natural resonance frequency to the ultrasonic horn and for passing a signal within the frequency range lower than the resonant frequency of the ultrasonic vibrator; signal extraction means for continuously detecting a load signal on the bonding tool in the direction toward and away from the bonding target using the load sensor during bonding operation and for extracting a signal within a frequency range lower than the resonant frequency of the ultrasonic vibrator, except for a signal within a frequency range of the natural resonance frequency to the ultrasonic horn, from a load signal through the filter means; and determination means for defining the maximum value of the signal extracted by the signal extraction means as an impact load and determining pass/fail of the bonding based on the impact load.

The present invention is advantageous in that it is possible to make a mid-bonding pass/fail determination.

BRIEF DESCRIPTION OF THE SEVERAL VIEWS OF THE DRAWINGS

Exemplary embodiments of the present invention will be described in detail based on the following figures, wherein.

DETAILED DESCRIPTION OF THE INVENTION

Figure 1:
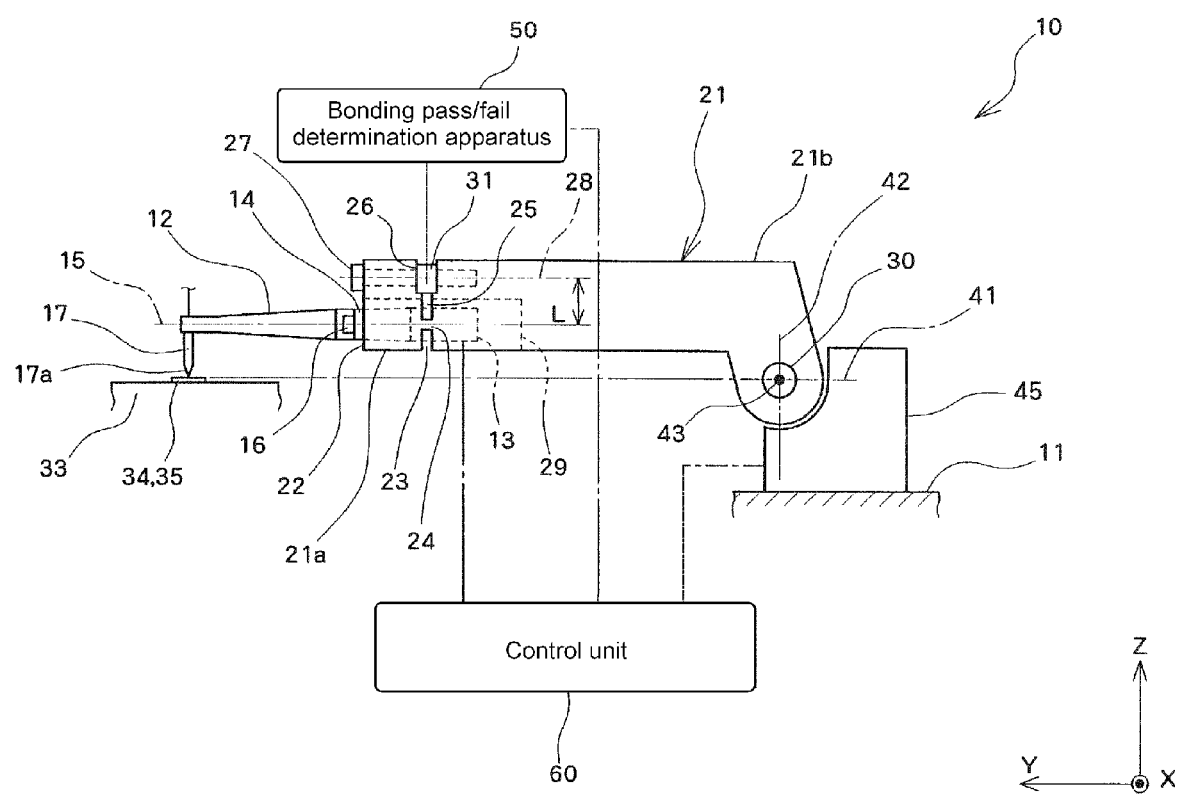
FIG. 1 illustrates a wire-bonding apparatus to which a bonding pass/fail determination apparatus according to an exemplary embodiment of the present invention is applied.

Exemplary embodiments of the present invention will hereinafter be described in detail with reference to the accompanying drawings. As shown in FIG. 1, a wire-bonding apparatus 10 in which a bonding pass/fail determination apparatus 50 according to an exemplary embodiment is installed includes a bonding head 11 serving as a base unit, an ultrasonic vibrator 13, an ultrasonic horn 12, a capillary 17 serving as a bonding tool, a flange 14 provided on the ultrasonic horn 12, a bonding arm 21, a load sensor 31, a drive motor 45, a control unit 60, and a bonding stage 33 on which a semiconductor chip 34 or a substrate 35 is absorbed and fixed as a bonding target.

The drive motor 45 for rotating the bonding arm 21 is provided on the bonding head 11. The ultrasonic vibrator 13 is formed by overlaying multiple piezoelectric elements and attached at the rear end of the ultrasonic horn 12. The capillary 17 is attached at one end of the ultrasonic horn 12. The flange 14 is provided at a node of the vibration of the ultrasonic horn 12 to be described hereinafter and fixed using a bolt 16 to a flange mounting surface 22 at one end of the bonding arm 21.

The bonding arm 21 is attached rotatably about a rotation axis 30 provided on the bonding head 11. The center of rotation 43 of the bonding arm 21 is coplanar with the surface of the substrate 35 absorbed on the bonding stage 33 or the surface of the semiconductor chip 34 mounted on the substrate 35.

The bonding arm 21 has an approximately rectangular parallelepiped shape extending in a direction along the central axis 15 of the ultrasonic horn 12, and has a front end portion 21a including the flange mounting surface 22 and a rear end portion 21b including the center of rotation 43. The front and rear end portions 21a and 21b are connected via a thin plate-like connection 24 provided at a height position (in the Z direction) including the central axis 15 of the ultrasonic horn 12. Between the front and rear end portions 21a and 21b of the bonding arm 21, narrow slits 23 and 25 are formed, respectively, on the side of the bonding surface 41 and its opposite side with respect to the connection 24. In a Z-directional upper part of the bonding arm 21 on the opposite side of the bonding surface 41, there is provided with a groove 26 for fitting the load sensor 31 therein. The groove 26 is provided in an opposed manner between the front and rear end portions 21a and 21b of the bonding arm 21. The load sensor 31 fitted in the groove 26 is sandwiched in between the front and rear end portions 21a and 21b of the bonding arm 21 and pressurized using screws 27 inserted through the front end portion 21a into the rear end portion 21b. The central axis 28 of the load sensor 31 is offset from the central axis 15 of the ultrasonic horn 12 by a distance of L in the Z direction, a direction in which the tip end 17a of the capillary 17 moves toward and away from the bonding surface 41. The distance L is greater than the Z-directional width of the flange 14 to have high rigidity against a bending force applied from the capillary 17 onto the ultrasonic horn 12.

Figure 2A:
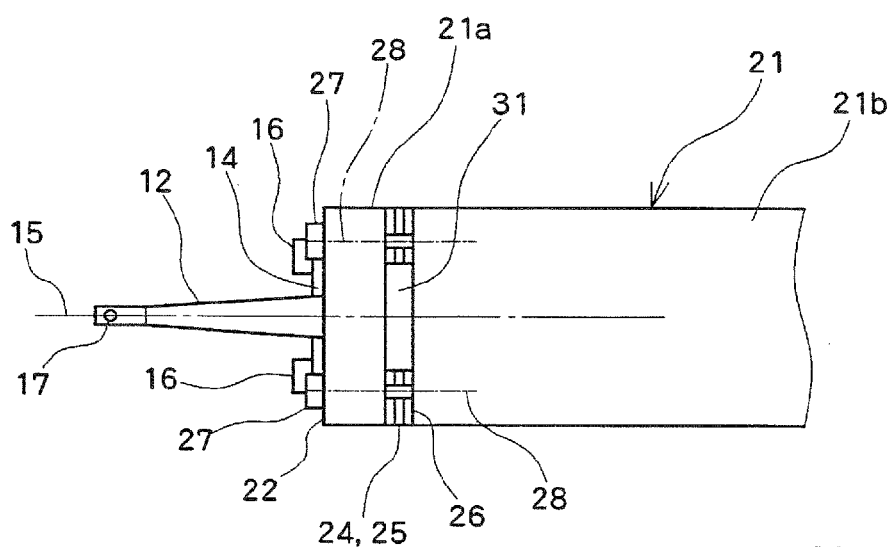
FIG. 2A is a top plan view of a bonding arm in the wire-bonding apparatus to which the bonding pass/fail determination apparatus according to an exemplary embodiment of the present invention is applied.
Figure 2B:
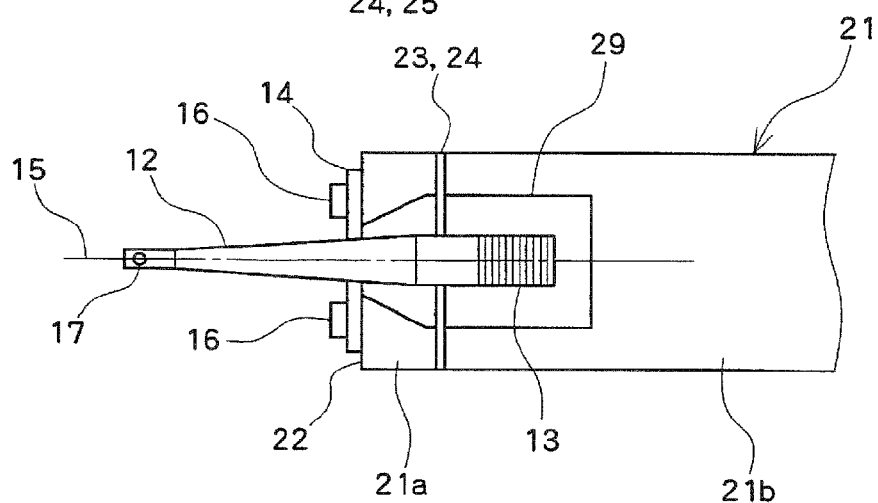
FIG. 2B is a bottom plan view of a bonding arm in the wire-bonding apparatus to which the bonding pass/fail determination apparatus according to an exemplary embodiment of the present invention is applied.

As shown in FIG. 2A, the load sensor 31 is mounted at the center in the width direction of the bonding arm 21, and the screws 27 are provided on either side of the load sensor 31. As shown in FIG. 2B, a recess 29 for housing the ultrasonic horn 12 and ultrasonic vibrator 13 therein is provided on the side of the bonding surface 41 in the bonding arm 21.

Figures 3A, 3B:
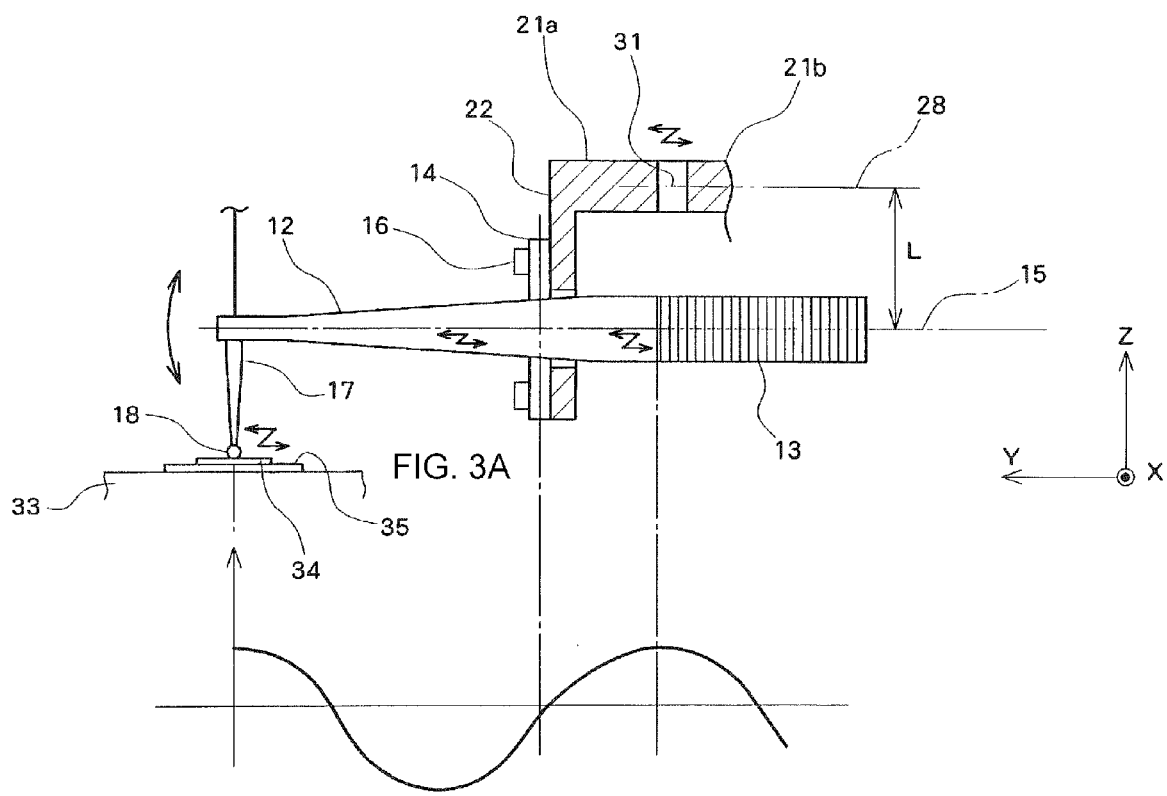
FIG. 3 is a schematic view illustrating ultrasonic vibration in the wire-bonding apparatus to which the bonding pass/fail determination apparatus according to an exemplary embodiment of the present invention is applied.

As shown in FIG. 3, the ultrasonic horn 12 is configured to vibrate in a longitudinal direction along the central axis 15 in resonance with the ultrasonic vibrator 13. Longitudinal vibration here means that the direction of propagation of the vibration and the direction of its amplitude are identical. As schematically shown in FIG. 3, the vibration of the ultrasonic vibrator 13 that is attached to the rear end of the ultrasonic horn 12 causes the ultrasonic horn 12 to vibrate between the rear end at which the ultrasonic vibrator 13 is attached and the front end at which the capillary 17 is attached in a resonant mode in which anti-nodes of the vibration are formed at the rear and front ends. The flange 14 is then provided at a node of the vibration between the rear and front ends, that is, a site that does not vibrate even in a resonant state to fix the ultrasonic horn 12 to the bonding arm 21. The flange 14 is fixed by using the bolt 16 to the flange mounting surface 22 on the bonding arm 21. Since the flange 14 does not vibrate with the resonance of the ultrasonic horn 12, ultrasonic vibration due to the resonance of the ultrasonic horn 12 cannot propagate to the flange mounting surface 22 on the bonding arm 21. Therefore, the ultrasonic vibration due to the resonance of the ultrasonic horn 12 cannot also propagate to the load sensor 31 provided on the bonding arm 21. It is noted that FIG. 3 is a schematic view illustrating the relationship among the bonding arm 21, ultrasonic horn 12, flange 14, and bolt 16, where the flange 14, which extends horizontally in the XY direction from the ultrasonic horn 12, is drawn vertically. Also, FIG. 3 (b) schematically illustrates the amplitude of the ultrasonic horn 12, where the amplitude in the direction along the central axis 15 is drawn as orthogonal to the central axis 15.

As shown in FIG. 1, the bonding pass/fail determination apparatus 50 is connected with the load sensor 31 and includes a low-pass filter. The low-pass filter has a notch feature by which a signal within a frequency range lower than the frequency of resonance $f_0$ of the ultrasonic vibrator 13 passes and a signal within a frequency range of the frequency of resonance $f_1$ specific to the ultrasonic horn 12 is cut off. It is therefore possible to extract from a signal detected by the load sensor 31 a signal within the frequency range lower than the frequency of resonance $f_0$ of the ultrasonic vibrator 13 not including a signal within the frequency range of the frequency of resonance $f_1$ specific to the ultrasonic horn 12. The ultrasonic vibrator 13 and the drive motor 45 are connected to the control unit 60, whereby the control unit 60 can control the output of the ultrasonic vibrator 13 and the direction of rotation as well as output of the drive motor 45. The bonding pass/fail determination apparatus 50 is also connected to the control unit 60, whereby the control unit 60 can receive a signal of pass/fail determination of bonding.

The bonding pass/fail determination apparatus 50 and the control unit 60 can be configured as a computer including a CPU, memory, etc. Alternatively, the detection and control systems can be configured by an electric circuit.

Next will be described the operation of the thus arranged bonding pass/fail determination apparatus 50 of detecting an impact load at the tip end 17a of the capillary 17 during bonding operation using the wire-bonding apparatus 10.

The control unit 60 shown in FIG. 1 forms a tip end of a wire extending out of the tip end 17a of the capillary 17 into a spherical initial ball 18 using such as a discharge torch (not shown). The control unit 60 then issues a command to drive the drive motor 45. Receiving this command, the drive motor 45 starts to rotate and lower the capillary 17 onto the semiconductor chip 34. The control unit 60 also issues a command to start the vibration of the ultrasonic vibrator 13. Receiving this command, the ultrasonic vibrator 13 is applied by a voltage for a vibration output preset correspondingly to bonding conditions. The bonding pass/fail determination apparatus 50 starts to store a load signal from the load sensor 31 into a memory.

Before the initial ball 18 formed at the tip end of the capillary 17 comes into contact with the surface of the semiconductor chip 34, the ultrasonic horn 12 is in resonance with the vibration of the ultrasonic vibrator 13 and vibrates longitudinally with anti-nodes of the vibration being formed at the front end where the capillary 17 is attached and the rear end where the ultrasonic vibrator 13 is attached, as shown in FIG. 3. The flange 14, which is arranged at a node of the vibration, does not vibrate with the resonance of the ultrasonic horn 12 and thus the load sensor 31 detects no load. However, the ultrasonic horn 12 undergoes a small vibration in the Z direction at the specific frequency of resonance $f_1$ due to a collision with a pad during bonding operation. Therefore, the load sensor 31 detects a small periodically fluctuating load due to the vibration of the ultrasonic horn 12 as shown in FIG. 4 (a).

Figures 4A, 4B, 4C:
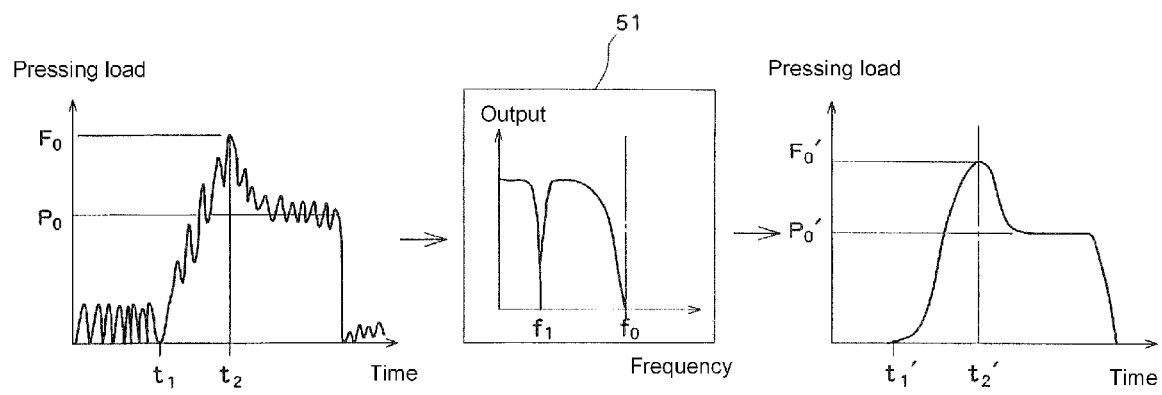
FIG. 4 illustrates signal processing at the bonding pass/fail determination apparatus according to an exemplary embodiment of the present invention.

The bonding arm 21 is accelerated with the drive motor 45 and collides with a pad on the semiconductor chip 34 at a predetermined lowering speed at time $t_1$ in FIG. 4 (a). This causes the pressing load detected with the load sensor 31 to increase rapidly to reach a maximum value of $F_1$ at time $t_2$ in FIG. 4 (a). The control unit 60 then controls the drive motor 45 to make the pressing load detected with the load sensor 31 equal to a predetermined pressing load $P_0$. After a predetermined pressing time has passed, the control unit 60 then drives the drive motor 45 in the opposite direction of the initial drive to raise the capillary 17. When the capillary 17 is raised, the pressing load detected with the load sensor 31 decreases gradually to be zero, and thereafter the load sensor 31 detects a small periodic fluctuation due to the natural vibration of the ultrasonic horn 12 in the Z direction. During this operation, the bonding pass/fail determination apparatus 50 stores load signals from the load sensor 31 into the memory, and then stores the maximum value $F_1$ into another memory as an impact load.

Figure 5A:
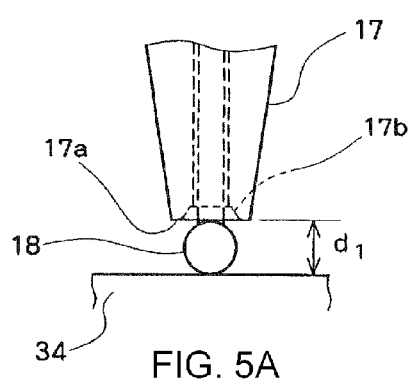
FIG. 5A illustrates a change in the state of an initial ball during bonding operation in the wire-bonding apparatus to which the bonding pass/fail determination apparatus according to an exemplary embodiment of the present invention is applied.
Figure 5B:
FIG. 5B illustrates a further change in the state of the initial ball during bonding operation in the wire-bonding apparatus to which the bonding pass/fail determination apparatus according to an exemplary embodiment of the present invention is applied.
Figure 5B:
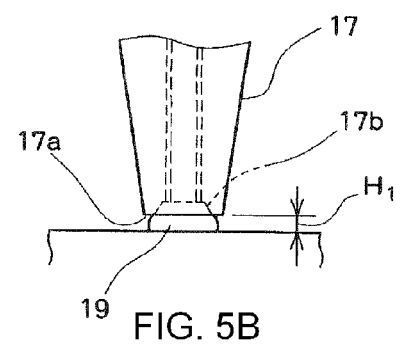
Figure 5C:
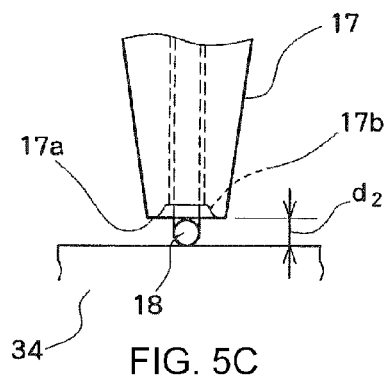
FIG. 5C also illustrates a change in the state of an initial ball during bonding operation in the wire-bonding apparatus to which the bonding pass/fail determination apparatus according to an exemplary embodiment of the present invention is applied.
Figure 5D:
FIG. 5D illustrates a further change in the state of the initial ball during bonding operation in the wire-bonding apparatus to which the bonding pass/fail determination apparatus according to an exemplary embodiment of the present invention is applied.
Figure 5D:
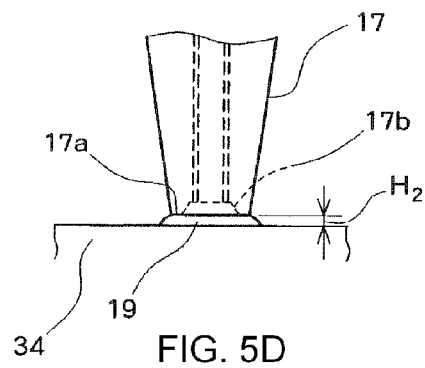

If the initial ball 18 is formed to have a predetermined diameter of $d_1$ as shown in FIG. 5A, the impact load due to the lowering of the capillary 17 deforms the initial ball 18 into a disk-like bonded ball 19 having a predetermined thickness of $H_1$ as shown in FIG. 5B. In contrast, if the initial ball 18 has a diameter of $d_2$ smaller than a predetermined value as shown in FIG. 5C, the initial ball 18, when deformed with the tip end 17a of the capillary 17, gets into an inner chamfer 17b formed at the tip end of the capillary 17, so that the bonded ball 19 has a thickness of $H_2$ smaller than the predetermined thickness $H_1$ as shown in FIG. 5D, resulting in abnormal ball deformation. If the diameter of the initial ball 18 is $d_2$, which is smaller than the predetermined diameter $d_1$, the load sensor 31 detects a larger impact load than if the initial ball 18 has the predetermined diameter $d_1$ because the energy of the impact load cannot be absorbed by the deformation of the initial ball 18. When the impact load detected with the load sensor 31 is thus larger than a predetermined value, it is determined that there occurs abnormal ball deformation or the like.

In order to detect the impact load accurately, it is also necessary for the load sensor 31 to be attached at a site not to be deformed by the impact load. In the exemplary embodiment, the load sensor 31 is attached to the rigid rectangular parallelepiped bonding arm 21 with an offset from the central axis 15 of the ultrasonic horn 12 greater than the Z-directional width of the flange 14, whereby the load sensor 31 can detect accurately the impact load.

The bonding pass/fail determination apparatus 50 compares the impact load stored in the another memory with a predetermined threshold value stored in still another memory and, if the impact load stored in the another memory is larger than the predetermined threshold value, determines that there occurs defective bonding such as abnormal ball deformation or chip damage, and then, for example, turns on a lamp that indicates the occurrence of defective bonding. The bonding pass/fail determination apparatus 50 can further output a defective bonding signal to the control unit 60, stop the wire-bonding apparatus 10, and turn on an abnormal operation warning lamp.

As shown in FIG. 4 (b), the bonding pass/fail determination apparatus 50 can include a low-pass filter 51 having a notch feature by which a signal within a frequency range lower than the frequency of resonance $f_0$ of the ultrasonic vibrator 13 passes and a signal within a frequency range of the frequency of resonance $f_1$ specific to the ultrasonic horn 12 is cut off, extract from a signal detected by the load sensor 31a signal within the frequency range lower than the frequency of resonance $f_0$ of the ultrasonic vibrator 13 not including a signal within the frequency range of the frequency of resonance $f_1$ specific to the ultrasonic horn 12, and store the extracted signal into the memory to detect the maximum value as an impact load $F_0'$. In this case, since high-frequency components and periodic fluctuation components due to the frequency of resonance $f_1$ specific to the ultrasonic horn 12 are removed from the load signal detected with the load sensor 31, data of a simple curve is stored in the memory, as shown in FIG. 4 (c), whereby the impact load $F_0'$ as the maximum value can determine easily. It is further possible, for example, to detect the load signal from the load sensor 31 at a constant cycle time, extract a signal through the low-pass filter 51, store extraction data of only a predetermined number of cycles in the memory, and detect the value of the extracted signal when the amount of increase in the value of the extraction data switches from positive to negative as the maximum value to detect the impact load more quickly.

Figure 6:
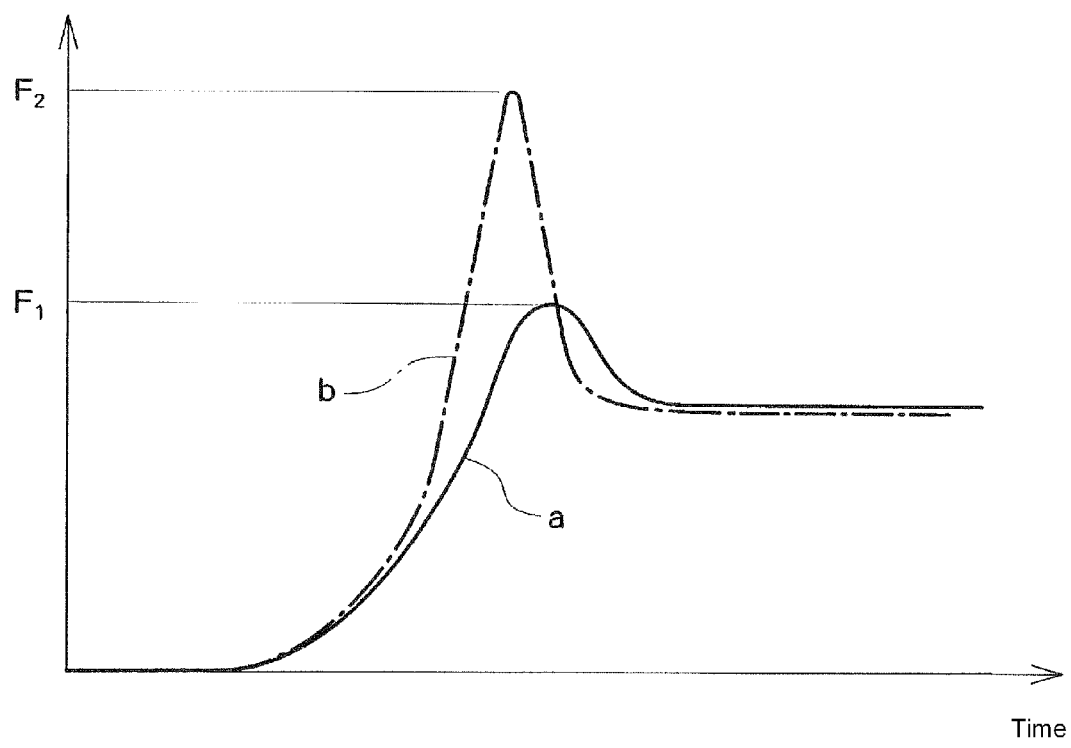
FIG. 6 is a graph illustrating how pressing load changes in time after filtering in the bonding pass/fail determination apparatus according to an exemplary embodiment of the present invention.

As shown in FIG. 6, if the diameter of the initial ball 18 is smaller than the predetermined diameter $d_1$, the impact load increases and the gradient of increase in the signal extracted through the filter 51 indicated with the alternate long and short dash line "b" in FIG. 6 is greater than the gradient of increase in the signal extracted during normal bonding operation indicated with the solid line "a" in FIG. 6. It can therefore be determined that there occurs defective bonding such as abnormal ball deformation if the rate of increase in the extracted signal to time is greater than a threshold value.

As described above, the bonding pass/fail determination apparatus 50 according to the exemplary embodiment offers the advantage of making a mid-bonding pass/fail determination and detection. This advantage of making a mid-bonding pass/fail determination and detection also allows the wire-bonding apparatus 10 to be stopped immediately after defective bonding, if occurred, offering the advantage that the product with the defective bonding can be revised easily. Further, the production of the product with the defective bonding can be stopped during the bonding operation, offering the advantage of improving production yield.

Although the defective bonding is described as abnormal ball deformation in the exemplary embodiment, the present invention can also be applied to determination of defective bonding due to damage on a semiconductor chip or the like. Although the wire-bonding apparatus 10 is exemplified in the description of the exemplary embodiment, the present invention can also be applied to other kinds of bonding apparatuses such as bump bonders.

In the description of the exemplary embodiment above, defective bonding is determined by the bonding pass/fail determination apparatus 50 that is provided separately from the control unit 60. Another exemplary embodiment will hereinafter be described in which the wire-bonding apparatus 10 is arranged such that the control unit 60 makes a determination of defective bonding. Components identical to those in the exemplary embodiment described with reference to FIGS. 1 to 6 are designated with the same reference numerals to omit the description thereof.

Figure 7:
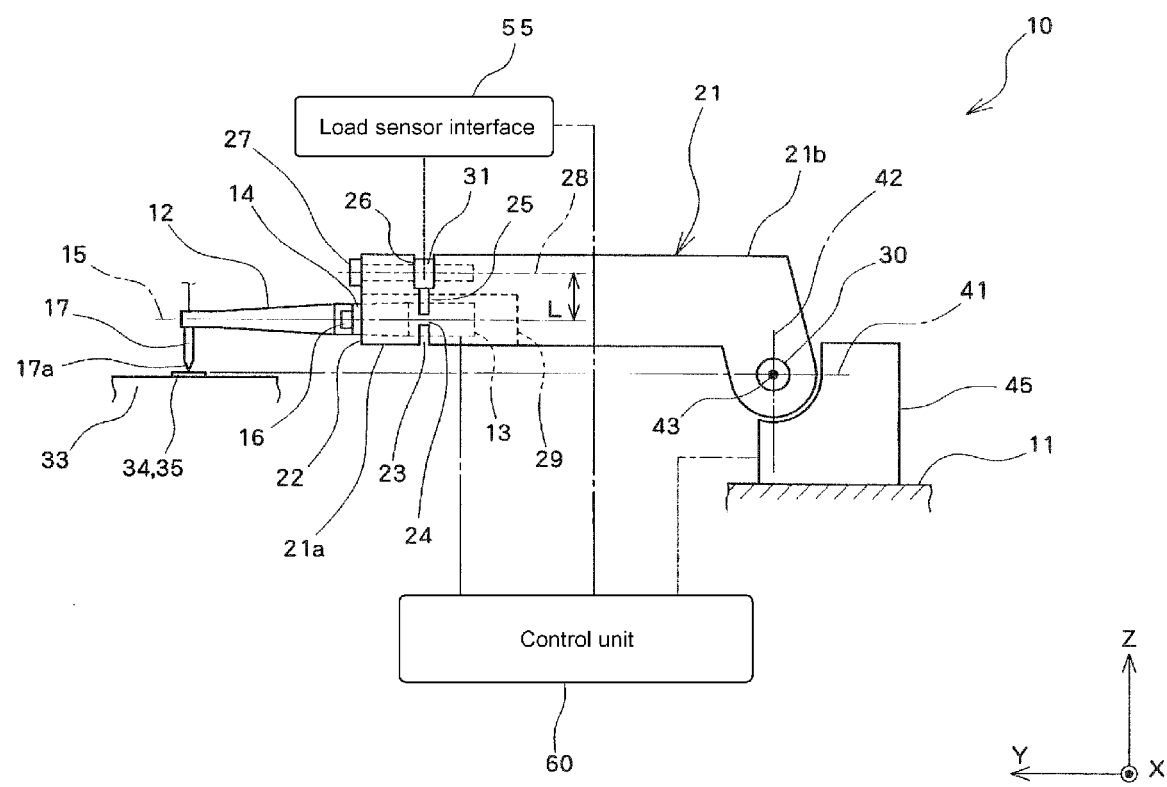
FIG. 7 illustrates a wire-bonding apparatus according to another exemplary embodiment of the present invention.

As shown in FIG. 7, the wire-bonding apparatus 10 according to the exemplary embodiment is configured similarly to the wire-bonding apparatus 10 described with reference to FIGS. 1 to 3, except that the load sensor 31 is connected to the control unit 60 via a load sensor interface 55 so that the control unit 60 can acquire a signal from the load sensor 31. The load sensor interface 55 includes an ND converter to output an analog signal from the load sensor 31 to the control unit 60 as a digital signal.

The operation of the wire-bonding apparatus 10 according to the exemplary embodiment will hereinafter be described with reference to FIG. 8. As shown in Step S101 of FIG. 8, the control unit 60 controls the wire-bonding apparatus 10 to start a bonding action and acquires a signal from the load sensor 31 via the load sensor interface 55. As shown in Step S102 of FIG. 8, the control unit 60 then applies a digital filter such as an IIR or FIR filter (filter means) to the digital signal acquired from the load sensor 31 via the load sensor interface 55 and, as shown in Step S103 of FIG. 8, extracts a load signal within the frequency range lower than the frequency of resonance $f_0$ of the ultrasonic vibrator 13 not including a signal within the frequency range of the frequency of resonance $f_1$ specific to the ultrasonic horn 12, and then stores the signal into the memory (signal extraction means). In this case, the digital low-pass filter is only required to extract a load signal within the frequency range lower than the frequency of resonance $f_0$ of the ultrasonic vibrator 13 not including a signal within the frequency range of the frequency of resonance $f_1$ specific to the ultrasonic horn 12, that is, can be, for example, a low-pass filter having a notch feature by which a signal within a frequency range lower than the frequency of resonance $f_0$ of the ultrasonic vibrator 13 passes and a signal within a frequency range of the frequency of resonance $f_1$ specific to the ultrasonic horn 12 is cut off. A relatively simple curve such as shown in FIG. 4 (c) is stored in the memory of the control unit 60.

Figure 8:
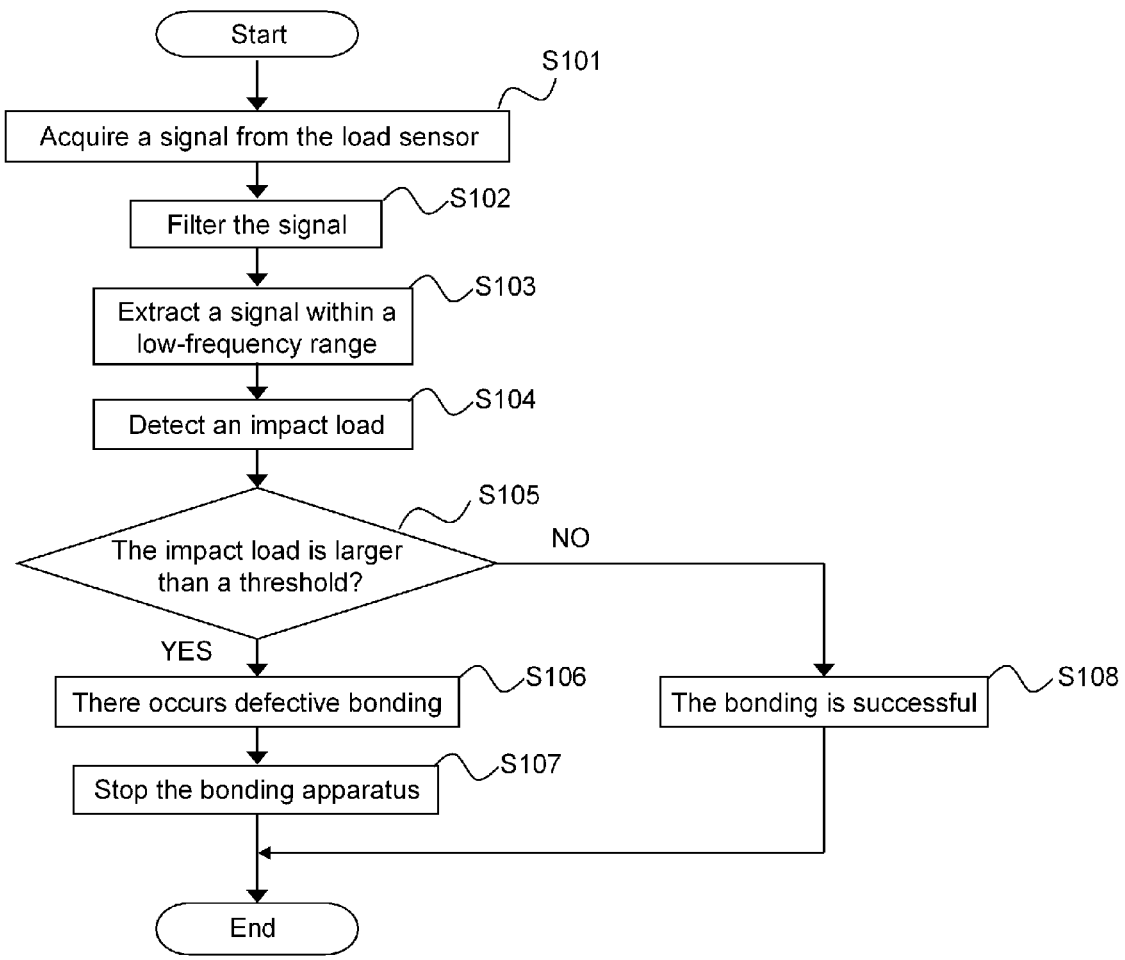
FIG. 8 is a flow chart illustrating an operation of the wire-bonding apparatus according to an exemplary embodiment of the present invention.

As shown in Step S104 of FIG. 8, the control unit 60 picks up the maximum value among the filtered extraction data stored in the memory to detect an impact load. In this case, the control unit 60 can store extraction data of only a predetermined number of cycles in the memory, and pick up the value of the extraction data when the amount of increase in the value switches from positive to negative as the maximum value to detect the impact load.

As shown in Step S105 of FIG. 8, the control unit 60 compares the detected impact load with a predetermined threshold value and, if the impact load is larger than the predetermined threshold value, determines that there occurs defective bonding as shown in Step S106 of FIG. 8, and stops the wire-bonding apparatus 10 as shown in Step S107 of FIG. 8. If the impact load is equal to or smaller than the predetermined threshold value, the control unit 60 determines that the bonding is successful as shown in Step S108 of FIG. 8 (determination means).

As described above, the wire-bonding apparatus 10 according to the exemplary embodiments offers the advantage of making a mid-bonding pass/fail determination and detection and thus being stopped immediately after defective bonding, if occurred, and that the product with the defective bonding can be revised easily. Further, the production of the product with the defective bonding can be stopped during the bonding operation, offering the advantage of improving production yield.

Although the wire-bonding apparatus 10 is exemplified in the description of the exemplary embodiments, the present invention can also be applied to other kinds of bonding apparatuses such as bump bonders.

The foregoing description of the exemplary embodiments of the present invention has been provided for the purpose of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention from various embodiments and with the various modifications as are suited to the particular use contemplated. It is intended that the scope of the invention be defined by the following claims and their equivalents.

What is claimed is:

1. A method of pass/fail determination of bonding in a bonding apparatus, comprising:
   preparing a bonding apparatus comprising:
      a base unit;
      an ultrasonic horn configured to vibrate longitudinally in resonance with the vibration of an ultrasonic vibrator;
      a bonding tool attached at an anti-node of the vibration of the ultrasonic horn;
      a flange provided at a node of the vibration of the ultrasonic horn;
      a bonding arm comprising a flange mounting surface, the flange being fixed to the ultrasonic horn, and attached rotatably to the base unit in such a manner as to move a tip end of the bonding tool in a direction toward and away from a bonding target; and
      a load sensor attached between the center of rotation of the bonding arm and the flange mounting surface in an offset manner in the direction toward and away from the bonding target from a longitudinal central axis of the ultrasonic horn;
   continuously detecting a load on the bonding tool in the direction toward and away from the bonding target using the load sensor during bonding operation;
   defining the maximum value of the detected load as an impact load; and
   determining pass/fail of the bonding based on the impact load.

2. The method of pass/fail determination of bonding according to claim 1, wherein
   if the impact load is larger than a predetermined threshold value, the bonding is determined to be defective.

3. The method of pass/fail determination of bonding according to claim 1, further comprising:
   extracting a signal within a frequency range lower than the resonant frequency of the ultrasonic vibrator, except for a signal within a frequency range of the natural resonance frequency to the ultrasonic horn, from a load signal detected with the load sensor through a filter that a signal within the frequency range of the natural resonance frequency to the ultrasonic horn is cut off and that is able to pass the signal within the frequency range lower than the resonant frequency of the ultrasonic vibrator; and
   determining pass/fail of the bonding based on the extracted signal.

4. The method of pass/fail determination of bonding according to claim 3, wherein
   after the grounding of the bonding tool, if the rate of increase in the load signal detected with the load sensor to time is greater than a threshold value, it is determined that there is abnormal ball deformation.

5. An apparatus for pass/fail determination of bonding used in a bonding apparatus, the apparatus comprising:
   a base unit;
   an ultrasonic horn configured to vibrate longitudinally in resonance with the vibration of an ultrasonic vibrator;
   a bonding tool attached at an anti-node of the vibration of the ultrasonic horn;
   a flange provided at a node of the vibration of the ultrasonic horn;
   a bonding arm comprising a flange mounting surface, the flange being fixed to the ultrasonic horn and attached rotatably to the base unit in such a manner as to move a tip end of the bonding tool in a direction toward and away from a bonding target; and a load sensor attached between the center of rotation of the bonding arm and the flange mounting surface in an offset manner in the direction toward and away from the bonding target from a longitudinal central axis of the ultrasonic horn, wherein the apparatus is extracting a signal within a frequency range lower than the resonant frequency of the ultrasonic vibrator, except for a signal within a frequency range of the natural resonance frequency to the ultrasonic horn, from a load signal detected with the load sensor through a filter that a signal within the frequency range of the natural resonance frequency to the ultrasonic horn is cut off and that is able to pass the signal within the frequency range lower than the resonant frequency of the ultrasonic vibrator, defining the maximum value of the extracted signal as an impact load, and determining pass/fail of the bonding based on the impact load.

6. A bonding apparatus comprising:

a base unit;

an ultrasonic horn configured to vibrate longitudinally in resonance with the vibration of an ultrasonic vibrator;

a bonding tool attached at an anti-node of the vibration of the ultrasonic horn;

a flange provided at a node of the vibration of the ultrasonic horn;

a bonding arm comprising a flange mounting surface, the flange being fixed to the ultrasonic horn and attached rotatably to the base unit in such a manner as to move a tip end of the bonding tool in a direction toward and away from a bonding target;

a load sensor attached between the center of rotation of the bonding arm and the flange mounting surface in an offset manner in the direction toward and away from the bonding target from a longitudinal central axis of the ultrasonic horn; and a control unit for pass/fail determination of bonding;

the control unit comprising:

filter means for cutting off a signal within the frequency range of the natural resonance frequency to the ultrasonic horn and for passing a signal within the frequency range lower than the resonant frequency of the ultrasonic vibrator, signal extraction means for continuously detecting a load signal on the bonding tool in the direction toward and away from the bonding target using the load sensor during bonding operation and for extracting a signal within a frequency range lower than the resonant frequency of the ultrasonic vibrator, except for a signal within a frequency range of the natural resonance frequency to the ultrasonic horn, from a load signal through the filter means, and determination means for defining the maximum value of the signal extracted by the signal extraction means as an impact load and determining pass/fail of the bonding based on the impact load.

* * * * *